US009831122B2

(12) United States Patent
Cooney, III et al.

(10) Patent No.: US 9,831,122 B2
(45) Date of Patent: Nov. 28, 2017

(54) INTEGRATED CIRCUIT INCLUDING WIRE STRUCTURE, RELATED METHOD AND DESIGN STRUCTURE

(75) Inventors: Edward C. Cooney, III, Jericho, VT (US); Jeffrey P. Gambino, Westford, VT (US); Zhong-Xiang He, Essex Junction, VT (US); Robert K. Leidy, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1130 days.

(21) Appl. No.: 13/482,864

(22) Filed: May 29, 2012

(65) Prior Publication Data

US 2013/0320536 A1 Dec. 5, 2013

(51) Int. Cl.
*H01L 23/48* (2006.01)
*H01L 21/768* (2006.01)
*H01L 23/522* (2006.01)
*H01L 23/525* (2006.01)
*H01L 23/532* (2006.01)
(Continued)

(52) U.S. Cl.
CPC .. *H01L 21/76879* (2013.01); *H01L 21/76843* (2013.01); *H01L 21/76885* (2013.01); *H01L 23/3192* (2013.01); *H01L 23/525* (2013.01); *H01L 23/5227* (2013.01); *H01L 23/5329* (2013.01); *H01L 24/03* (2013.01); *H01L 23/3114* (2013.01); *H01L 24/05* (2013.01); *H01L 2224/02166* (2013.01); *H01L 2224/03462* (2013.01); *H01L 2224/03831* (2013.01); *H01L 2224/04042* (2013.01); *H01L 2224/05567* (2013.01); *H01L 2224/05624* (2013.01); *H01L 2924/00014* (2013.01); *H01L 2924/01029* (2013.01); *H01L 2924/12042* (2013.01)

(58) Field of Classification Search
CPC ................................ H01L 23/48; H01L 29/40
USPC ......................................... 257/750, 751, 753
See application file for complete search history.

(56) References Cited

U.S. PATENT DOCUMENTS 6,117,769 A 9/2000 Nogami et al.
6,291,885 B1 9/2001 Cabral, Jr. et al.
(Continued)

OTHER PUBLICATIONS

Hsu et al., "Sn/Pd Catalyzation and Electroless Cu Deposition on TaN Diffusion Barrier Layers," Journal of The Electrochemical Society, 2002, pp. C143-C149.
(Continued)

*Primary Examiner* — Samuel Gebremariam
(74) *Attorney, Agent, or Firm* — David Cain; Hoffman Warnick LLC

(57) ABSTRACT

An integrated circuit (IC), design structure, and a method of making the same. In one embodiment, the IC includes: a substrate; a dielectric layer disposed on the substrate; a set of wire components disposed on the dielectric layer, the set of wire components including a first wire component disposed proximate a second wire component; a bond pad disposed on the first wire component, the bond pad including an exposed portion; a passivation layer disposed on the dielectric layer about a portion of the bond pad and the set of wire components, the passivation layer defining a wire structure via connected to the second wire component; and a wire structure disposed on the passivation layer proximate the bond pad and connected to the second wire component through the wire structure via.

6 Claims, 7 Drawing Sheets

(51) Int. Cl.
    *H01L 23/31*    (2006.01)
    *H01L 23/00*    (2006.01)

(56) References Cited

U.S. PATENT DOCUMENTS

| | | |
|---|---|---|
| 6,426,557 B1 | 7/2002 | Daubenspeck et al. |
| 6,444,568 B1 | 9/2002 | Sundararajan et al. |
| 6,472,304 B2 | 10/2002 | Chittipeddi et al. |
| 6,872,295 B2 | 3/2005 | Palmans et al. |
| 6,938,237 B1* | 8/2005 | El-Ghoroury ............... 716/104 |
| 7,098,537 B2 | 8/2006 | Cabral, Jr. et al. |
| 7,642,201 B2 | 1/2010 | Cerio, Jr. et al. |
| 2005/0160575 A1* | 7/2005 | Gambino et al. ............ 29/602.1 |
| 2007/0152333 A1 | 7/2007 | Lee |
| 2008/0080112 A1* | 4/2008 | Lin et al. ..................... 361/56 |
| 2008/0173976 A1* | 7/2008 | Stamper et al. .............. 257/531 |

OTHER PUBLICATIONS

Ong et al., "Design, Assembly and Reliability of Large Die (21 x 21 mm2) and Fine-pitch (150) Cu/Low-K Flip Chip Package," 2008, pp. 613-619.

U.S. Appl. No. 14/519,614, Non-Final Office Action dated Jan. 26, 2015.

Office Action Communication for U.S. Appl. No. 14/519,614, dated Aug. 17, 2015, 11 Pages.

\* cited by examiner

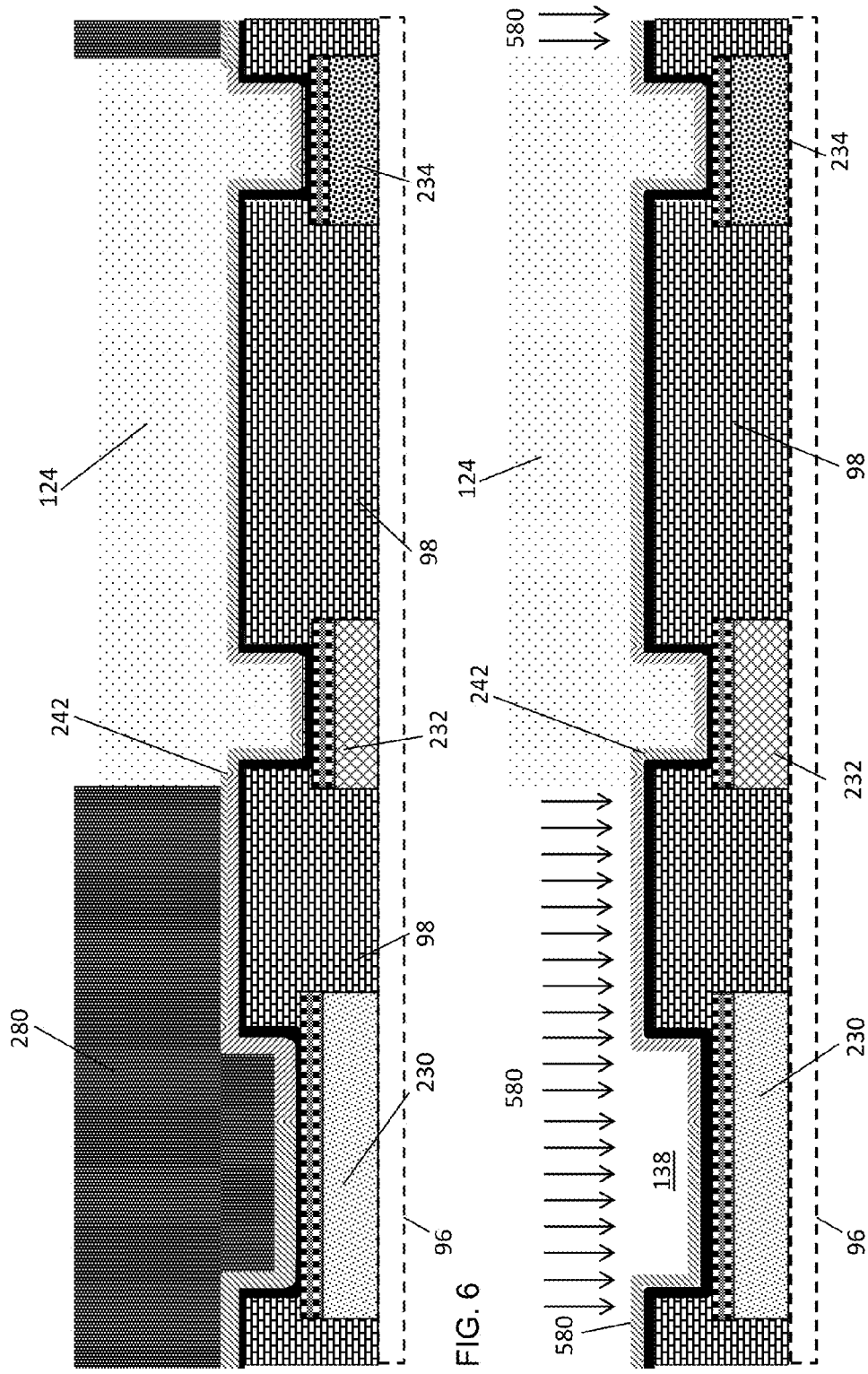

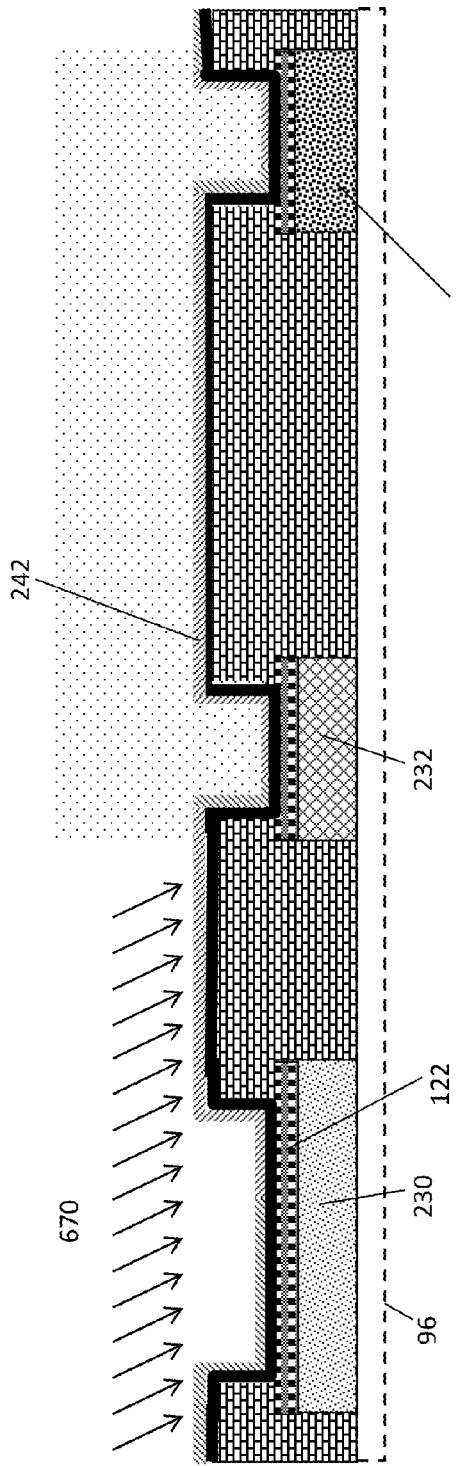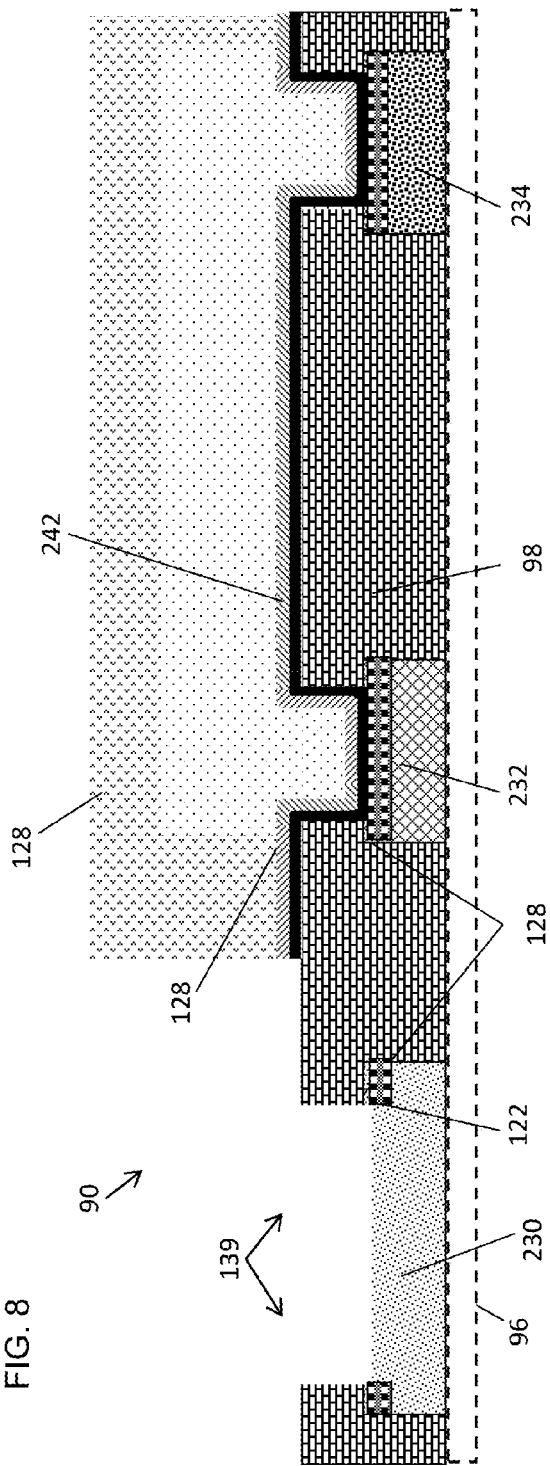

INTEGRATED CIRCUIT INCLUDING WIRE STRUCTURE, RELATED METHOD AND DESIGN STRUCTURE

FIELD OF THE INVENTION

The disclosure relates generally to integrated circuit (IC) chips and fabrication, and more particularly, to an IC including a set of wire structures disposed within a layer of the IC, a related method and design structure.

BACKGROUND

During integrated circuit (IC) fabrication, many device layers (e.g., metal layers, dielectric layers, silicon layers, etc.) are often disposed upon and/or proximate one another. These layers may include a plurality of components and may be interconnected to form the IC. Some components, layers, and designs may include the use and/or inclusion of thick (e.g., about 3 µm to about 10 µm) wires. These thick wires may include copper and be disposed proximate aluminum components/layers in the IC, forming components such as interconnects, portions of inductors, etc. For example, in ICs designed to be used as a part of radio-frequency (RF) technology, thick copper wires are often utilized to produce inductors with a quality factor (e.g., the ratio of inductive reactance to resistance at a given frequency) which meets design specifications. However, deposition of copper proximate aluminum may lead to undesirable reactions, and fabrication of thick copper wires by methods such as damascene processing may be difficult, time-consuming, and expensive.

BRIEF SUMMARY

A first aspect of the disclosure provides an integrated circuit including: substrate; a dielectric layer disposed on the substrate; a set of wire components disposed on the dielectric layer, the set of wire components including a first wire component disposed proximate a second wire component; a bond pad disposed on the first wire component, the bond pad including an exposed portion; a passivation layer disposed on the dielectric layer about a portion of the bond pad and the set of wire components, the passivation layer defining a wire structure via connected to the second wire component; and a wire structure disposed on the passivation layer proximate the bond pad and connected to the second wire component through the wire structure via.

A second aspect of the disclosure provides a method including: forming a dielectric layer on a substrate; forming a metal layer on the dielectric layer; processing the metal layer to form a set of wire components on the dielectric layer, the set of wire components including a first wire component proximate a second wire component; depositing a bond pad on the first wire component; forming a passivation layer on the dielectric layer and about portions of the set of wire components, the passivation layer including a wire component via connected to the second wire component; and forming a wire structure above the second wire component and physically isolated from the bond pad.

A third aspect of the disclosure provides a design structure tangibly embodied in a machine readable medium for design, manufacturing, or testing an integrated circuit, the design structure comprising: a substrate; a dielectric layer disposed on the substrate; a set of wire components disposed on the dielectric layer, the set of wire components including a first wire component disposed proximate a second wire component; a bond pad disposed on the first wire component, the bond pad including an exposed portion; a passivation layer disposed on the dielectric layer about a portion of the bond pad and the set of wire components, the passivation layer defining a wire structure via connected to the second wire component; and a wire structure disposed on the passivation layer proximate the bond pad and connected to the second wire component through the wire structure via.

BRIEF DESCRIPTION OF THE DRAWINGS

The above and other aspects, features and advantages of the disclosure will be better understood by reading the following more particular description of the disclosure in conjunction with the accompanying drawings.

FIGS. 2-9 show cross-sectional views illustrating a method of forming a portion of an integrated circuit according to embodiments of the invention.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-11, like numbering may represent like elements. Redundant explanation of these elements has been omitted for clarity. Finally, it is understood that the components of FIGS. 1-11 and their accompanying descriptions may be applied to any embodiment described herein.

DETAILED DESCRIPTION

Figure 1:
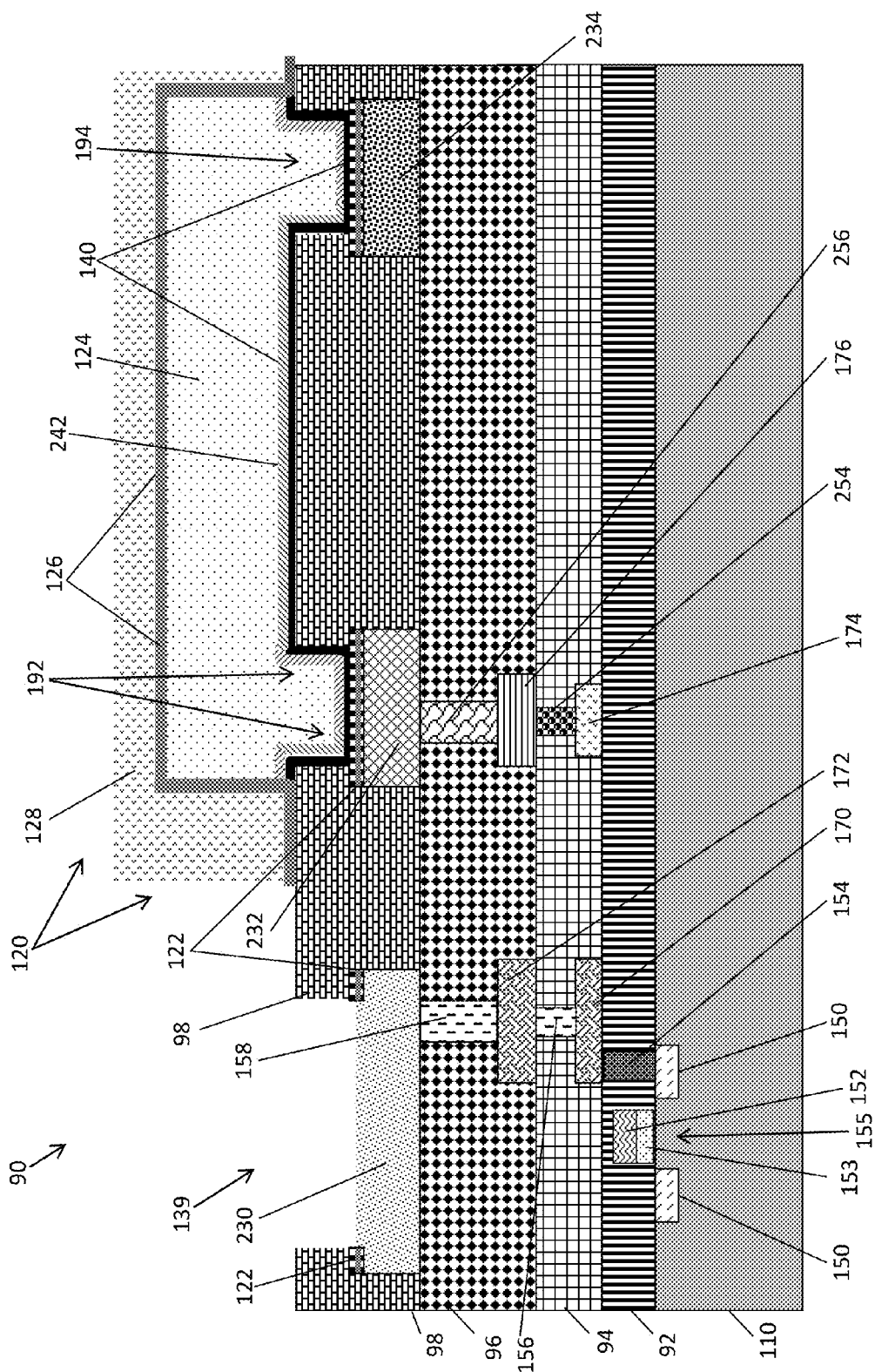
FIG. 1 shows a cross-sectional side view of a portion of an integrated circuit according to embodiments of the invention.

Turning to the drawings, FIG. 1 shows a cross-sectional side view of a portion of an integrated circuit (IC) 90 including a plurality of device layers 92, 94, 96, 98, and 110. IC 90 includes a substrate 110 (e.g., wafer) upon which a series of processes may be performed, including deposition of a pre-metal dielectric layer 92, and formation/deposition of a plurality of components in and/or upon pre-metal dielectric layer 92, the plurality of components including: a field effect transistor 155, a contact 154, a first metal (M1) layer 170 (e.g., a wire) and a second metal (M1) layer 174 (e.g., a wire). In one embodiment, first M1 layer 170 and second M1 layer 174 may be formed upon pre-metal dielectric layer 92 by metal deposition and patterning. A first dielectric layer 94 may be formed on pre-metal dielectric layer 92 and about first M1 layer 170 and second M1 layer 174. A first V1 via 156 and a second V1 via 254 may be formed in first dielectric layer 94 proximate and/or above first M1 layer 170 and second M1 layer 174. A first M2 layer 172 (e.g., a wire) and second M2 layer 176 (e.g., a wire) may be formed upon first dielectric layer 94 and proximate first V1 via 156 and second V1 via 254. First M2 layer 172 and second M2 layer 176 may be by formed by metal deposition and patterning. A second dielectric layer 96 may be formed on first dielectric layer 94 and about first M2 layer 172 and second M2 layer 176. A first V2 via 158 and a second V2 via 256 may be formed in second dielectric layer 96 proximate and/or above first M2 layer 172 and second M2 layer 176.

In an embodiment, first V2 via 158 may connect to a bond pad 230, and second V2 via 256 may connect to a first wire component 232. First dielectric layer 94 and second dielectric layer 96 may be comprised of, for example, a silicon oxide and/or organosilicate glass (e.g., SiCOH). IC 90 may further include a first passivation layer 98 which includes portions of a third metal (M3) layer 298 (shown in FIG. 2) formed upon first dielectric layer 94 and second dielectric layer 96. Third M3 layer 298 may include bond pad 230 (e.g., a wire bond pad, an aluminum pad, etc.) and a set of wire components (e.g., aluminum structures) including a first wire component 232, and a second wire component 234. In one embodiment, first passivation layer 98 may include organic (e.g., polyimide) materials and/or inorganic materials (e.g., silicon nitride (SiN), silicon dioxide ($SiO_2$), etc.), and may define a bond pad via 139 configured to complement and expose portions of bond pad 230. First passivation layer 98 may protect devices and components of IC 90 from contamination and mechanical damage during manufacture or use, by forming a barrier about the devices and components.

In an embodiment, a wire structure 120 may be formed proximate bond pad 230 and upon a portion of first passivation layer 98 above first wire component 232 and second wire component 234. A first V3 via 192 and a second V3 via 194 may extend through portions of first passivation layer 98 and connect wire structure 120 to either or both of first wire component 232 and second wire component 234, and/or portions of IC 90. Wire structure 120 may include a diffusion barrier 122 disposed upon portions of bond pad 230, first wire component 232 and second wire component 234. Diffusion barrier 122 may cover/insulate portions of IC 90 and thereby prevent interactions (e.g., chemical reactions) between components and materials. An adhesion layer 140 (e.g., titanium, tantalum, etc.) may substantially separate a thick wire 124 (e.g., wire with a cross-sectional dimension of about 3 μm to about 10 μm) in wire structure 120 from contacting first passivation layer 98 and/or components therein (e.g., first wire component 232, second wire component 234, etc.). Thick wire 124 may be formed as a part of a metallization process. Diffusion barrier 122 may be self-aligning and may include at least one of Tantalum (Ta), Titanium (Ti), Titanium Nitride (TiN), Tungsten (W), and Tantalum Nitride (TaN). Diffusion barrier 122 may be deposited and patterned at the same time that bond pad 230 and wire components 232 and 234, are formed in first passivation layer 98, thereby self-aligning diffusion barrier 122 to bond pad 230 and wire components 232 and 234.

In one embodiment, wire structure 120 may include a cap passivation layer 126 formed upon thick wire 124 and below a polyimide cap 128. Wire structure 120 may be located substantially laterally adjacent bond pad 230 and bond pad via 139. In one embodiment, wire structure 120 is located over first wire component 232 and second wire component 234, and portions of first passivation layer 98 there between. In another embodiment, wire structure 120 is located on diffusion barrier 122. Wire structure 120 may be located vertically distinct (e.g., not over, located at a separate lateral location on IC 90, etc.) relative either or both of bond pad 230 and bond pad via 139. It is understood that formation of any of substrate 110, pre-metal dielectric layer 92, first dielectric layer 94, second dielectric layer 96, first passivation layer 98 and wire structure 120 may include the formation, integration, interconnection, and/or deposition of components (e.g., wires, inductors, wire bond pads, etc.) as described herein.

In an embodiment, substrate 110 includes a set of isolation trenches 150 formed (e.g., shallow trench isolation) in a surface thereof. Devices in pre-metal dielectric layer 92 may include contact 154 and field effect transistor (FET) 155 which includes a gate conductor 152 disposed on a gate dielectric 153. Contact 154 may be configured to connect to a portion of substrate 110 and to portions of first M1 layer 170. In one embodiment, pre-metal dielectric layer 92 may include silicon dioxide ($SiO_2$), SiCOH, BPSG (boro-phosphosilicate glass) and/or PSG (phosphosilicate glass). First M1 layer 170 may be coated with first dielectric layer 94 and disposed proximate pre-metal dielectric layer 92 and contact 154. First M1 layer 170 may connect to first V1 via 156 which extends to contact first M2 layer 172 and/or components therein. In one embodiment, first M2 layer 172 may be connected to first V1 via 156, and connected to bond pad 230 through first V2 via 158. In one embodiment, first dielectric layer 94 may also include a second M1 layer 174 disposed proximate pre-metal dielectric layer 92 and a second V1 via 254 connected to portions of second M2 layer 176. Second V1 via 254 may connect to second M2 layer 176 which extends to contact a second V2 via 256 connected to second wire component 232.

A person skilled in the art will readily recognize that IC 90 is merely an exemplary embodiment, and that the location of components and layers in IC 90 may be adjusted or modified to meet specific design and/or performance needs. Further, it is understood that other structures have been omitted for clarity. The omitted structures may include any conventional interconnect components, passive devices, etc.

Substrate 110 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 110 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110, as illustrated and described, are well known in the art and thus, no further description is necessary.

Dielectrics used herein, (e.g., in first passivation layer 98, cap passivation layer 126, pre-metal dielectric layer 92, first dielectric layer 94, second dielectric layer 96, etc.) may include silicon dioxide ($SiO_2$), silicon nitride (SiN), polyimide, or any other suitable material. Any number of dielectric layers may be located over the IC/chip body, as many other layers included in semiconductor chips now known or later developed. In one embodiment, these layers may include silicon dioxide ($SiO_2$) for its insulating, mechanical and optical qualities. These layers may include, but are not limited to: silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. These layers may be deposited using conventional techniques described herein and/or those known in the art.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
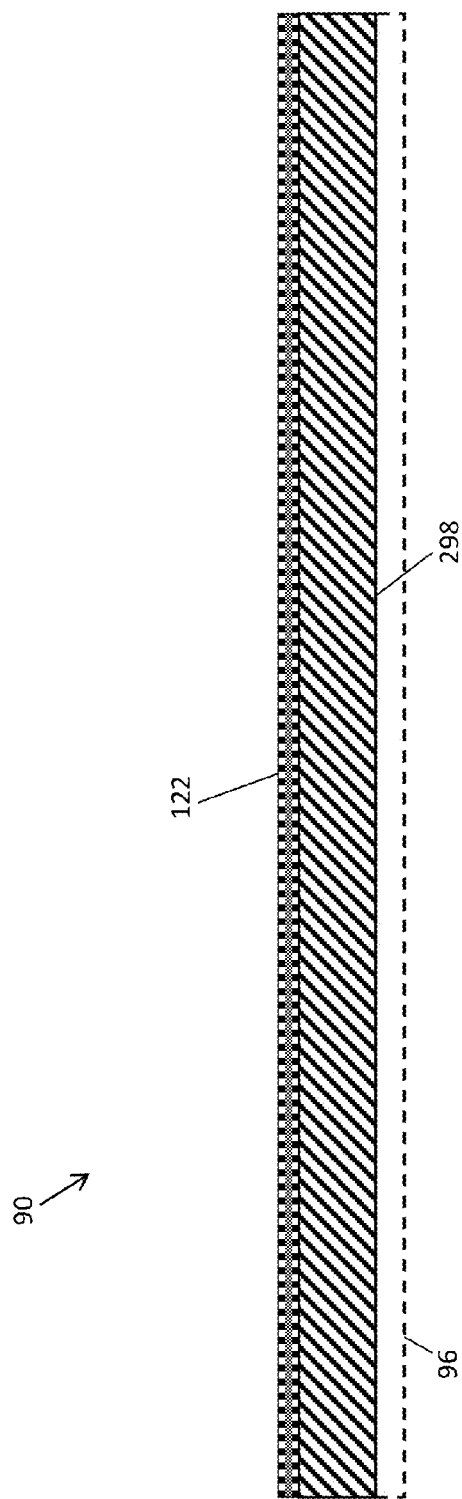
Figure 3:
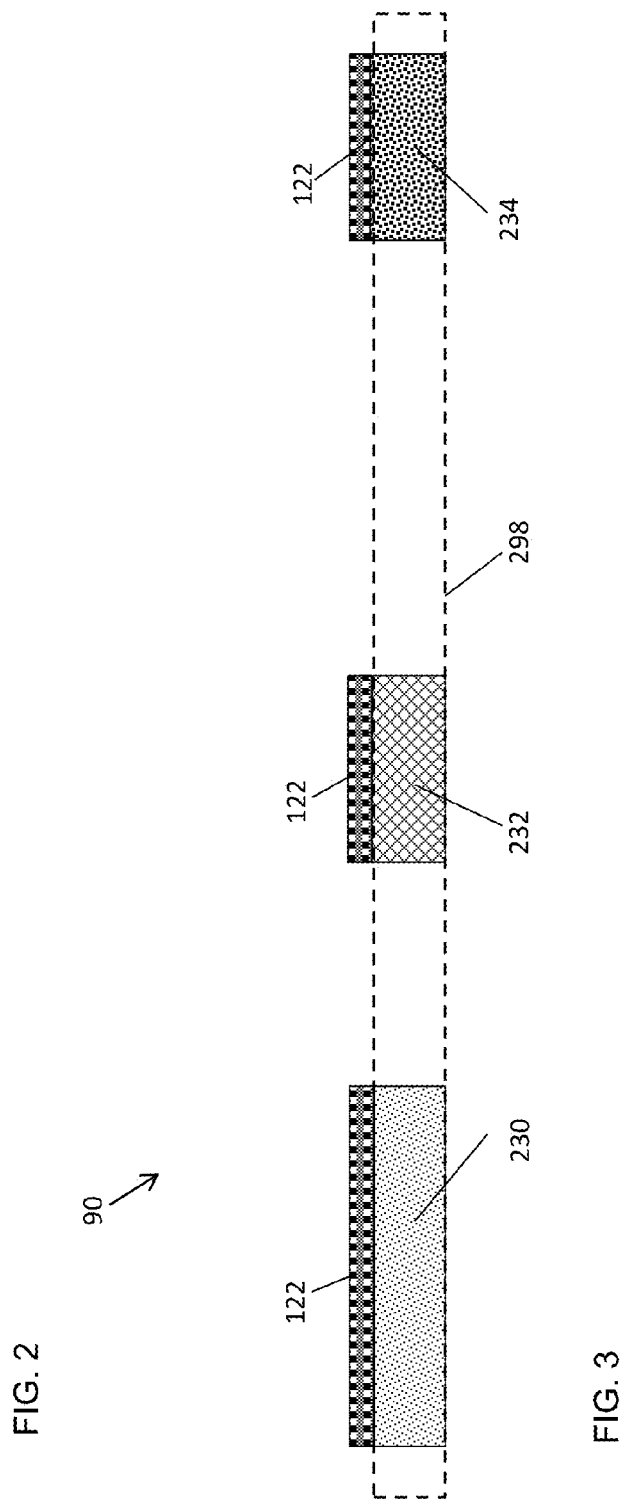

Turning to FIGS. 2-9, cross-sectional views illustrating a process in forming a portion of IC 90 (shown in FIG. 1) with wire structure 120 disposed proximate bond pad 230 in accordance with known methods is shown. FIG. 2 shows formation of a third metallization (M3) layer 298 which may be processed/patterned (e.g., etched) to form bond pad 230 and wire components 232, and 234. In this embodiment, diffusion barrier 122 is formed (e.g., deposited) on third M3 layer 298. FIG. 3 shows processing/patterning of diffusion barrier 122 and third M3 layer 298 (shown in phantom) to form first wire component 230, second wire component 232, and third wire component 234.

Figure 4:
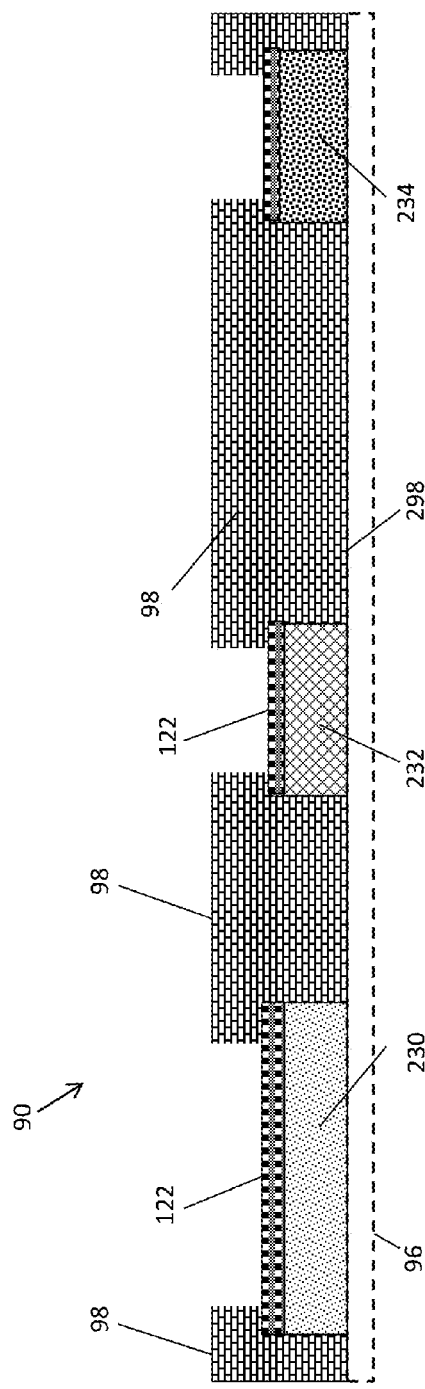

FIG. 4 shows formation of first passivation layer 98 upon second dielectric layer 96 (shown in phantom) and about portions of bond pad 230, first wire component 232, and second wire component 234. First passivation layer 98 (e.g., $SiO_2$, SiN, polyimide, etc.) is formed and patterned on and/or about bond pad 230, first wire component 232, and second wire component 234. It is understood that formation of third M3 layer 298, diffusion barrier 122, bond pad 230, first wire component 232, and second wire component 234, may include bulk conductor deposition (such as Al deposition), diffusion barrier deposition, lithography, RIE, and resist strip. These processes may include photoresist technique, etching or any other known or to be developed techniques.

Figure 5:
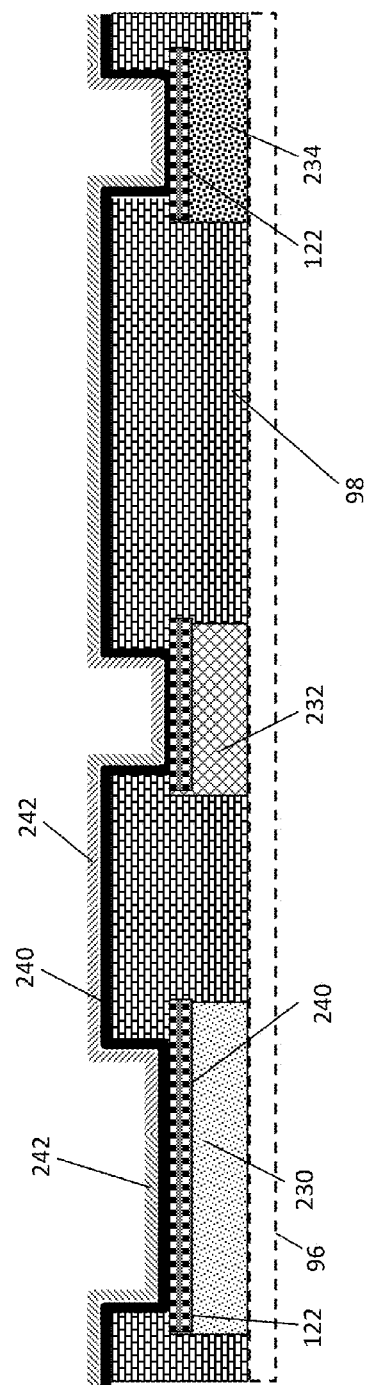

Turning to FIG. 5, an adhesion layer 240 is formed on first passivation layer 98 and diffusion barrier 122 to enable adequate application of a seed layer 242 (e.g., copper seed layer). In one embodiment, adhesion layer 240 may include titanium (Ti), TiN, Ta, TaN, TiW (Titanium Tungsten), Cr, or combinations of these materials. Following formation of adhesion layer 240, seed layer 242 (e.g., a copper (Cu) seed layer, a gold (Au) seed layer, a silver (Ag) seed layer, a tin (Sn) seed layer, etc.) may be formed upon adhesion layer 240 and configured to enable formation of a wire on IC 90 (e.g., through Cu electroplating, Au electroplating, Sn electroplating, Ag electroplating, etc.). Formation of either or both of adhesion layer 240 and seed layer 242 may include sputter deposition.

Turning to FIG. 6, a resist pattern 280 is formed above bond pad 230 and portions of IC 90. Resist pattern 280 may include openings for formation of thick wire 124 (e.g., wire with a cross-sectional dimension of about 3 μm to about 10 μm thick) above first wire component 232 and second wire component 234, and be configured to form wires or inductors using electroplating of copper or other like materials during manufacturing processes. Following formation of resist pattern 280, thick wire 124 may be formed on portions of seed layer 242 not covered by resist pattern 280. In one embodiment, thick wire 124 may be formed through electroplating and may be positioned above portions of first passivation layer 98, first wire component 232, and/or second wire component 234. Following formation of thick wire 124, as shown in FIG. 7, IC 90 may be subjected to a strip resist 580 to remove resist pattern 280. Once resist pattern 280 is removed, portions of seed layer 242 and adhesion layer 240 may be exposed. As shown in FIG. 8, IC 90 may be subjected to an etch 670 (e.g., wet etch, dry etch, etc.) to remove portions of seed layer 242 and adhesion layer 240 in the exposed areas over bond pad 230, thereby isolating thick wire 124 from adjacent wires and bond pads, and exposing bond pad 230 substantially adjacent wire structure 120.

Turning to FIG. 9, diffusion barrier 122 may be removed from portions of bond pad 230 in and/or about bond pad via 139. In one embodiment, portions of diffusion barrier upon bond pad 230 in bond pad via 139 may be removed by etching (e.g., reactive ion etching (RIE)). In one embodiment, a second passivation layer 128 (e.g., polyimide) may be formed and/or patterned about thick wire 124, thereby forming wire structure 120 proximate bond pad 230. In one embodiment, wire structure 120 may be located out of plane (e.g., substantially within a separate layer of IC 90) with bond pad 138.

Figure 10:
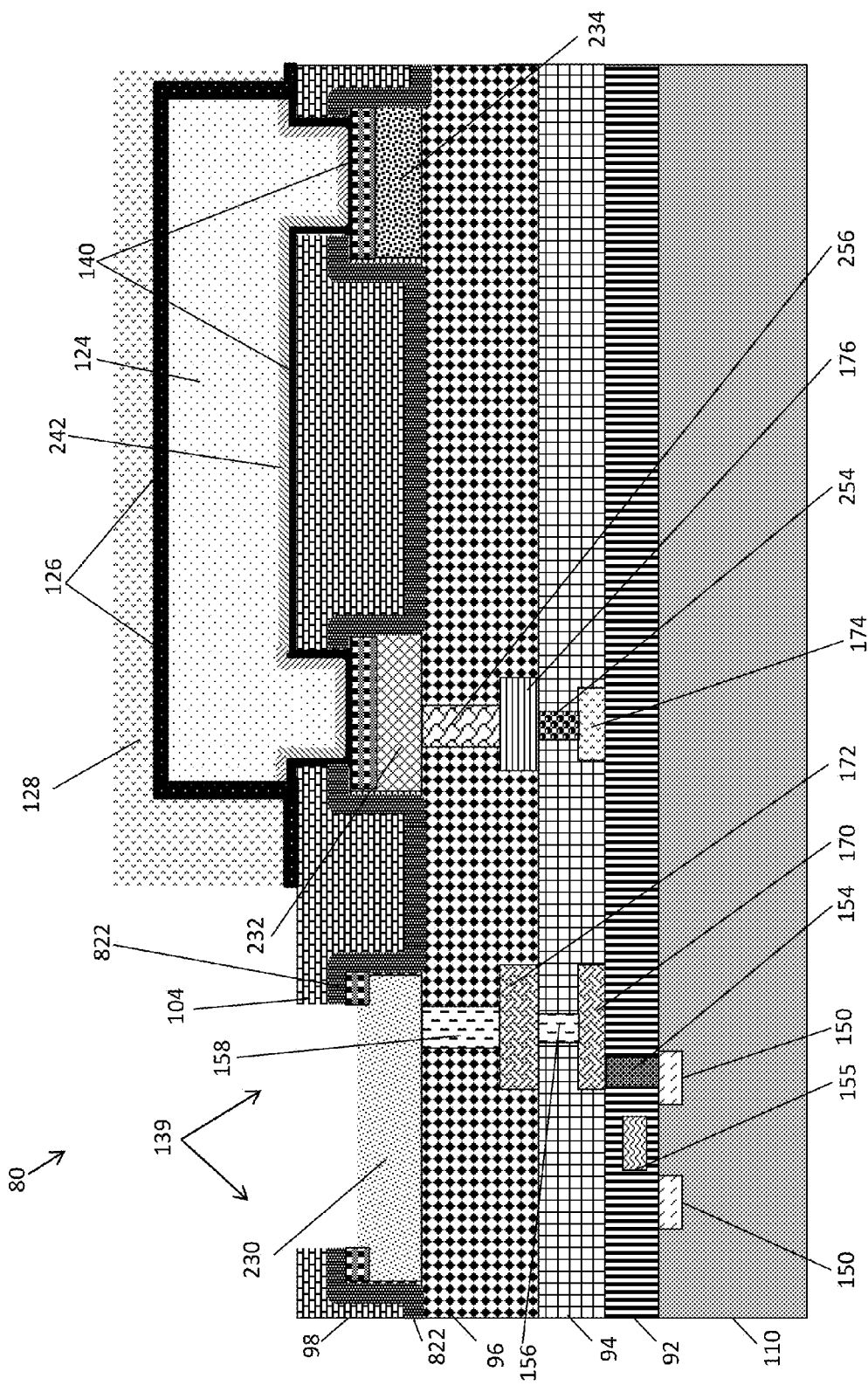
FIG. 10 shows a cross-sectional view of a portion of an integrated circuit according to embodiments of the invention.

Referring to FIG. 10, a cross sectional view of one alternative embodiment of an IC 80 in accordance with this invention is shown. In this embodiment, an inorganic passivation layer 822 is disposed between second dielectric layer 96 and first passivation layer 98. Inorganic passivation layer 822 may include silicon nitride or silicon oxide, and may physically separate passivation layer 98 from bond pad 230, and/or aluminum structures 232 and 234.

Figure 11:
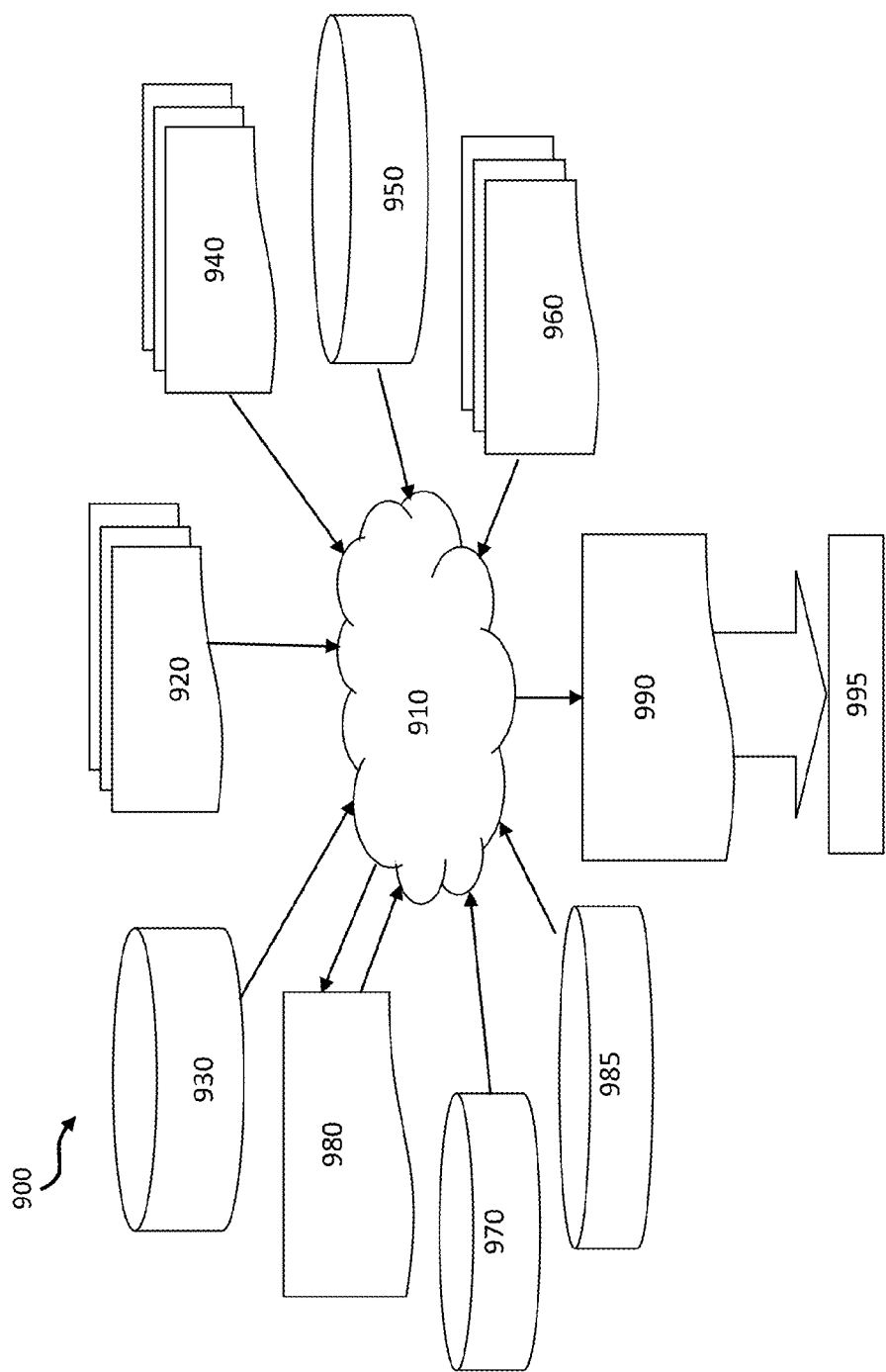
FIG. 11 is a flow diagram of a design process used in semiconductor design, manufacture, and/or test according to embodiments of the invention.

Turning to FIG. 11, a flow diagram of a design flow 900 used in semiconductor design, manufacture, and/or test is shown according to embodiments of the invention. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, graphical representations, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both sursurface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A design structure tangibly embodied in a machine readable medium for design, manufacturing, or testing an integrated circuit, the design structure comprising:
    a substrate;
    a dielectric layer disposed on the substrate;
    a set of wire components disposed on the dielectric layer, the set of wire components including a first wire component disposed proximate a second wire component on a same level of the integrated circuit;
    a bond pad disposed on the same level as the first wire component, the bond pad including an exposed portion;
    a passivation layer disposed on the dielectric layer about a portion of the bond pad and the set of wire components, the passivation layer defining a wire structure via connected to the second wire component;
    a wire structure disposed on the passivation layer proximate the bond pad and connected to the second wire component through the wire structure via, wherein the wire structure includes:
        a thick wire disposed over the second wire component and a portion of the passivation layer, wherein the thick wire has a cross-sectional dimension of about 3 micrometers to about 10 micrometers; and
        a passivation cap layer disposed over the thick wire; and
    a polyimide cap disposed over the passivation cap layer.

2. The design structure of claim 1, further comprising a diffusion barrier disposed within the wire structure via between the second wire component and a thick wire in the wire structure.

3. The design structure of claim 2, wherein the diffusion barrier is self-aligned and the wire structure is physically isolated from the bond pad.

4. The design structure of claim 1, further comprising a third wire component disposed on the dielectric layer proximate the second wire component, the wire structure located above the second wire component and the third wire component, and connected to the third wire component through a second wire structure via.

5. The design structure of claim 1, wherein the bond pad is disposed laterally adjacent the wire structure via.

6. An integrated circuit comprising:
    a substrate;
    a dielectric layer disposed on the substrate;
    a set of wire components disposed on the dielectric layer, the set of wire components including a first wire component disposed proximate a second wire component on a same level of the integrated circuit;
    a bond pad disposed on the same level as the first wire component, the bond pad including an exposed portion;
    a passivation layer disposed on the dielectric layer about a portion of the bond pad and the set of wire components, the passivation layer defining a wire structure via connected to the second wire component; and
    a wire structure disposed on the passivation layer proximate the bond pad and connected to the second wire component through the wire structure via, wherein the wire structure includes:
        a thick wire disposed over the second wire component and a portion of the passivation layer, wherein the thick wire has a cross-sectional dimension of about 3 micrometers to about 10 micrometers; and
        a passivation cap layer disposed over the thick wire, wherein the thick wire includes copper and the bond pad includes aluminum; and
    a polyimide cap disposed over the passivation cap layer.

* * * * *